United States Patent [19]

Gupta et al.

[11] Patent Number: 5,463,336

[45] Date of Patent: Oct. 31, 1995

[54] SUPPLY SENSING POWER-ON RESET CIRCUIT

[75] Inventors: Rajiv Gupta, Brea; Raouf Halim; Daryush Shamlou, both of Laguna Niguel, all of Calif.

[73] Assignee: Rockwell International Corporation, Seal Beach, Calif.

[21] Appl. No.: 186,939

[22] Filed: Jan. 27, 1994

[51] Int. Cl.[6] .................................................. H03K 17/22
[52] U.S. Cl. ........................... 327/143; 327/215; 327/198
[58] Field of Search ........................... 307/272.1, 263, 307/291, 296.4, 272.3, 600, 601, 605; 327/143, 170, 185, 198, 199, 215, 219, 261, 263, 285, 545, 546

[56] References Cited

U.S. PATENT DOCUMENTS

| | | | |
|---|---|---|---|
| 4,788,454 | 11/1988 | Tanagawa et al. | 307/272.3 |
| 4,900,950 | 2/1990 | Dubjet | 307/272.3 |
| 4,947,064 | 8/1990 | Kim et al. | 307/605 |
| 4,948,995 | 8/1990 | Takahashi | 307/272.3 |
| 5,035,875 | 8/1991 | Chang | 307/272.3 |
| 5,068,553 | 11/1991 | Love | 307/605 |
| 5,151,614 | 9/1992 | Yamazaki et al. | 307/594 |
| 5,172,012 | 12/1992 | Ueda | 307/272.3 |
| 5,177,375 | 1/1993 | Ogawa et al. | 307/272.3 |

FOREIGN PATENT DOCUMENTS

| | | | |
|---|---|---|---|
| 57-91029 | 6/1982 | Japan | 307/272.3 |
| 59-64921 | 4/1984 | Japan | 307/272.3 |

*Primary Examiner*—Terry D. Cunningham
*Attorney, Agent, or Firm*—George A. Montanye; David J. Arthur; Philip K. Yu

[57] ABSTRACT

A circuit for detecting a system reset caused by the turning on of power supply of an electronic system. The circuit comprises: latch means coupled to said power supply having a SET input and an output, said output of said latch means being reset to a first predetermined state during power-on; feedback means for receiving said output from said latch means and said system reset, said feedback means activating its output when both of said first predetermined state from said latch means, output and said system reset are present; delay means coupled to the output from said feedback means and to said latch means, said delay means activating its output a predetermined time after said delay means receiving an activated output from said feedback means, said activated output from said delay means setting said latch means to a second predetermined state such that said feedback means remains de-activated when only said system reset is present without power-on.

8 Claims, 2 Drawing Sheets

SUPPLY SENSING POWER-ON RESET CIRCUIT

FIELD OF THE INVENTION

The present invention relates to integrated circuits and more particularly to VLSI components with supply sensing and supply adaptive capability.

BACKGROUND OF THE INVENTION

VLSI devices are quite common nowadays in electronic and computer systems for enhancing their functionality while reducing their dimension. However, as more and more systems operate on different voltage levels, a device, or a group of devices such as a modem chip set, must be able to detect the supplied voltage level and adapt itself accordingly. When the device is plugged in and the system is powered up, the device is typically reset by the system so that the device can configure its I/O's consistent with the voltage level of the power supply. Whether the power supply is at 3 volt or 5 volt, the device must detect the power supply before any program execution takes place. Once the device is properly configured, no other reconfiguration is necessary as long as the power is still on.

Typically, upon power-on, a system reset is also generated to reset the system and the plugged-in devices. This process is commonly known as a "cold start". A cold start is also followed by a brief delay of about 80–100 mS for stabilization and supply detection. There is, however, another form of reset, "warm reset", with the power still on, which can be invoked by the user or other controlling parts of the system. A warm reset does not and should not require the device to re-detect the voltage level of the power supply because 1) the power is still on and the existing configuration is still valid, and 2) reconfiguration would unnecessarily slow the system down.

Therefore, it would be desirable to be able to distinguish between a system reset caused by the power-on process ("cold start") and a system reset unrelated with power-on ("warm reset").

Also, it would be desirable to be able to ignore any subsequent system resets, "warm resets", once a cold start is completed.

Further, it would be desirable to have a supply sensing circuit which is robust against any transients from the power supply such that a warm reset would not be mistaken as a cold start.

SUMMARY OF THE PRESENT INVENTION

A circuit for detecting a system reset caused by the turning on of power supply of an electronic system is disclosed. The circuit comprises: latch means coupled to said power supply having a SET input and an output, said output of said latch means being reset to a first predetermined state during power-on; feedback means for receiving said output from said latch means and said system reset, said feedback means activating its output when both of said first predetermined state from said latch means' output and said system reset are present; delay means coupled to the output from said feedback means and to said latch means, said delay means activating its output a predetermined time after said delay means receiving an activated output from said feedback means, said activated output from said delay means setting said latch means to a second predetermined state such that said feedback means remains de-activated when only said system reset is present without power-on.

DETAILED DESCRIPTION OF THE PREFERRED EMBODIMENTS

A supply-sensing power-on reset circuit is disclosed. In the following description, numerous specific details are set forth, such as voltage levels, polarities, transistor types, logic gates, etc., in order to provide a thorough understanding of the present invention. It will be obvious, however, to one skilled in the art that these details are not required to practice the present invention. In other instances, well known circuits, methods and the like are not set forth in detail in order to avoid unnecessarily obscuring the present invention.

Figure 1:
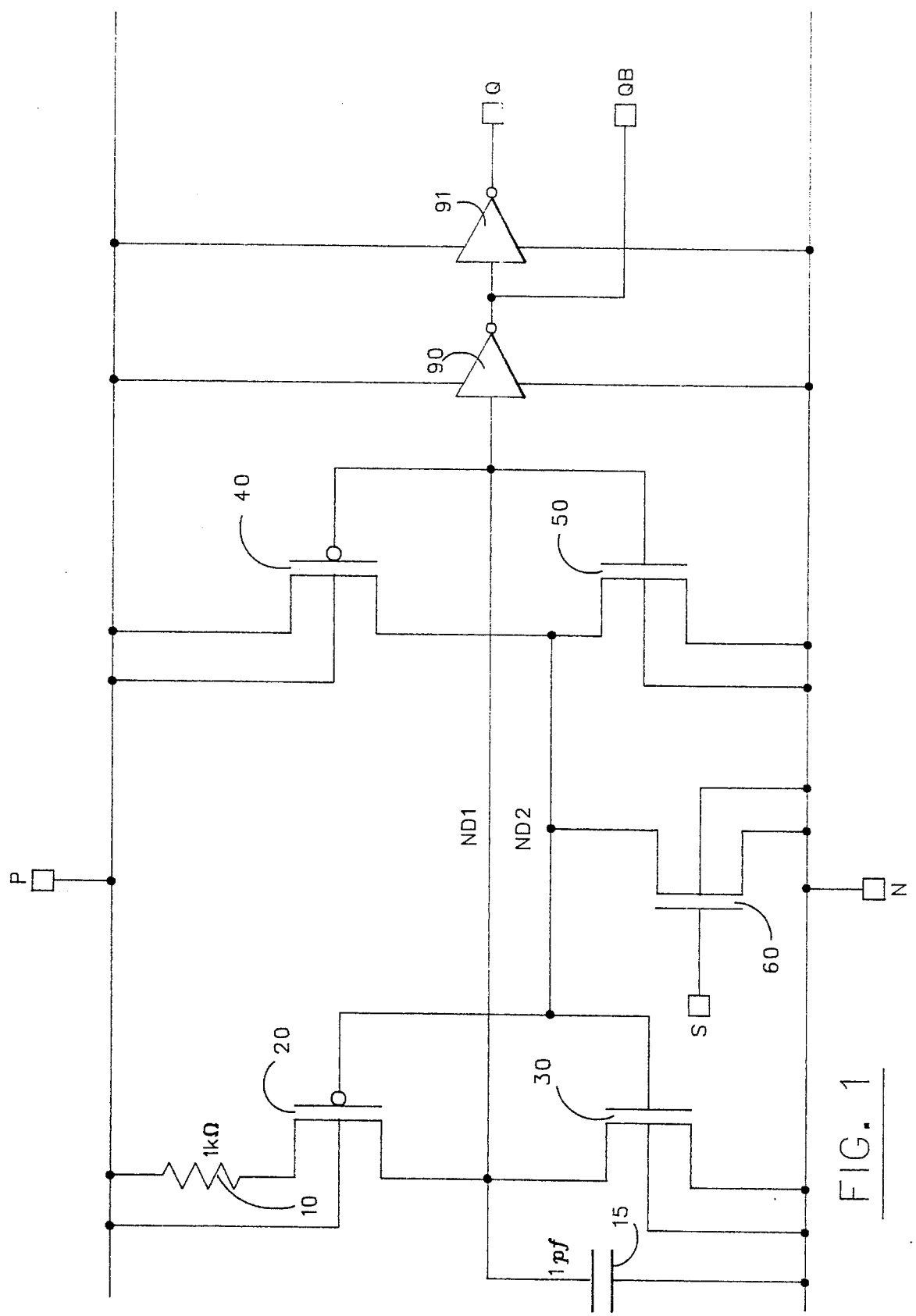
FIG. 1 is a circuit diagram of a modified D-type flip-flop incorporated in the present invention.

References is made to FIG. 1, where a circuit diagram of a modified latch is illustrated. As illustrated in FIG. 1, a conventional latch having p-channel field effect transistors ("PFET") 20, 40 and n-channel field effect transistors ("NFET") 30, 50 is modified by the additional resistor 10 and capacitor 15 to become an imbalanced latch. Currently, resistor 10 is 1K ohm and capacitor 15 is 1 pf. The gate terminals of PFET 20 and NFET 30 are connected to the drains of NFET's 50, 60 to form node ND2. Similarly, the gate terminals of PFET 40 and NFET 50 are connected together to form node ND1. Capacitor 15 is connected between ND1 and ground terminal N. A SET signal can be applied to the gate of NFET 60 to set the output of the latch. To improve the drive capability, the signal at node ND1 is driven by inverters 90, 91 to reach the output terminal Q.

As will be appreciated by those skilled in the art, the output of a conventional latch is at an unknown state when the device is powered up. However, the modified latch, as illustrated in FIG. 1, is "unbalanced" in that its output is designed to be in a known state due to the addition of resistor 10 and capacitor 15. When terminal P is turned on during power-on, its effect to PFET 20 is slowed by virtue of the RC circuit (resistor 10 and capacitor 15). Also, since NFET 30 is sized to be larger than PFET 20 and PFFT 40 is sized to be larger than NFET 50, Node ND1 is thus assured to be pulled to a known state-here, a low logic level. As a result, when the modified latch is powered up, its output is pulled to a predictable state. Further, those skilled in the art will appreciate that a latch so designed can be quite robust against any power supply transients.

Figure 2:
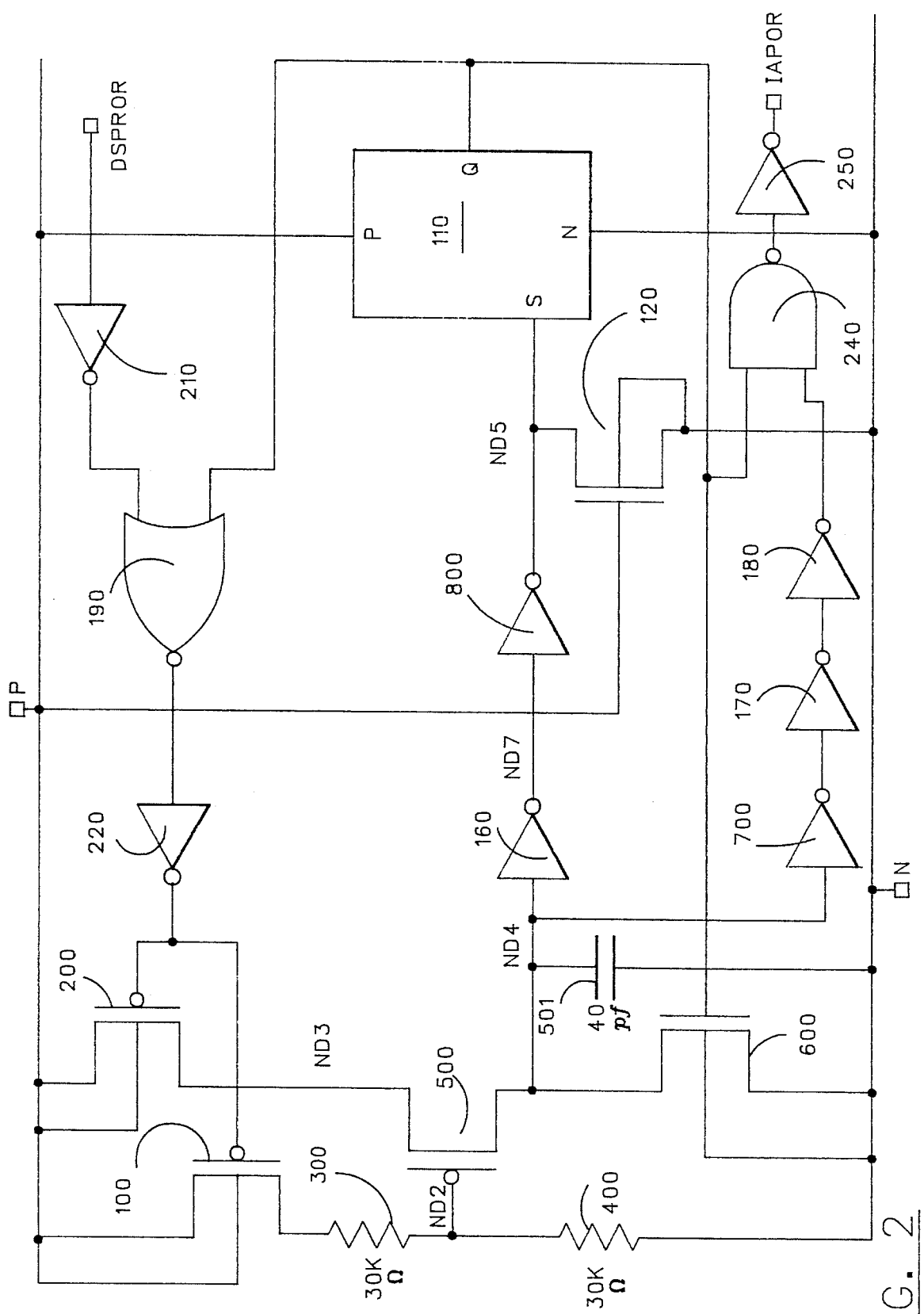
FIG. 2 is a circuit diagram of the preferred embodiment of the present invention.

Reference is made to FIG. 2, where a circuit diagram of the preferred embodiment of the present invention is illustrated. Referring to FIG. 2, latch 110 is modified as previously illustrated in FIG. 1. The output Q from latch 110 is connected to the input of NOR-gate 190. System reset DSPROR is applied to the other input of NOR-gate 190 through an inverter 210. The output of NOR-gate 190 is connected to the gate terminals of PFET 100, 200, through an inverter 220. Resistors 300, 400 are connected between the source of PFET 100 and terminal N. Currently, both resistors 300, 400 are 30K ohms; however, those skilled in the art should be able to determine their particular requirement consistent with their applications.

Node ND2 is formed between resistors 300, 400 and the gate terminal of PFET 500. The source of PFET 500 is connected to the source of PFET 200. The drain of PFET 500 forms node ND4, which is connected to the SET input of latch 110 through two buffer/inverters 160, 800. Node ND5 is formed at the connection of the SET input and the drain of NFET 120. The gate of NFET 120 is connected to terminal P, while the source is connected to terminal N. A relatively large capacitor, of which the purpose will be further described, currently at 40 pf, is connected between ground and node ND4.

Node 4 is also connected to the input of NAND gate 240, through three buffer/inverters 700, 170, 180. The other input to NAND gate 240 comes from output Q of latch 110. The output of NAND gate 240 represents an internal power-on reset signal IAPOR to be used for other power-on reset-related functions, such as starting the internal reset counter.

When a device is "cold started," i.e. power-on followed by a system reset as previously described, the output Q of unbalanced latch 110 is forced to a known state of logic level "0", while its SET terminal 13 is de-activated (set to logic level "0") by the ON state of NFET 120. On the other hand, the system reset as a result of the cold start is concurrently applied through DSPROR and inverter 210 to input to NOR gate 190. The logic "0" levels of both inputs causes NOR gate 190 to output a logic level "1", which is inverted by buffer 220. The resultant logic level "0" turns on both PFET's 100, 200 to pull nodes ND2 and ND3 high. PFET 500, being operational in its linear region to provide an ON-resistance to resister 300, thus gradually pulls node ND4 toward a logic high state. However, because of the relatively large capacitor 501, node ND4 is prevented from being immediately pulled to the high state. Capacitor 501 thus becomes charged after an RC time delay later, which is determined by the capacitance and ON-resistance of PFET 500.

When ND4 is finally in a logic high state ND5 is set. Setting latch 110 will cause output Q to go to logic level "1", which effectively disables the NOR gate 190 so that no other system resets from DSPROR can effectively pass through NOR gate 190 to alter the state of latch 110. As such, no internal power-on reset IAPOR can be generated from node ND4 because all subsequent system resets DSPROR are ignored by NOR gate 190 when the power is already on.

When latch 110 is set by ND5, its output turns off NOR-gate 190 and PFET'S 100 & 200. However, the output from latch 110 turns on NFET 600 to allow capacitor 501 to discharge through NFET 600. The ON-resistance of NFET 600 & capacitance operate like an RC time delay for discharge. When capacitor 501 is fully discharged, ND4 turns low, thus turning off NAND-gate 240 to alter IAPOR's state. Changing from a first state to a second state, based on RC from charging & discharging capacitor 501 gives the desired total internal delay for a "cold start" condition.

As will be appreciated by those skilled in the art, unbalanced latch 110, upon power up, will activate a feedback loop at NOR gate 190 jointly with a system reset DSPROR. After NOR gate 190 is activated, node ND4 is pulled high after an RC delay and pulled low after another delay. This changing of states can be used to generate the total internal delay, as well as setting latch 110 to another state, thus preventing further feedback (to eventually set the latch) caused by the subsequent system resets when the power is already on.

What is claimed is:

1. A circuit for detecting a predetermined system reset signal caused by the turning on of power supply of an external electronic system, comprising:

latch means coupled to said power supply having a SET input and an output, said output of said latch means being reset to a first predetermined state during power-on;

first n-type transistor coupled to said latch means having its gate coupled to a first terminal of said power supply, its source coupled to a second terminal of said power supply and its drain coupled to said SET input for de-activating said SET signal upon power-on;

feedback means for receiving said output from said latch means and said predetermined system reset signal, said feedback means activating its output when both of said first predetermined state from said latch means' output and said predetermined system reset signal are present;

delay means coupled to the output from said feedback means and to said latch means, said delay means activating its output a predetermined time after said delay means receives an activated output from said feedback means, said activated output from said delay means setting said latch means to a second predetermined state which de-activates said feedback means, said feedback means remaining de-activated when said predetermined system reset signal is applied while the power of said electronic system is already on;

said latch means comprising:
   first p-type transistor having its source coupled to said first terminal of said power supply;
   a resistor coupled between said first terminal of said power supply and the source of said first p-type transistor;
   second n-type transistor having its drain coupled to the drain of said first p-type transistor to form a first node, both gates of said first p- and said second n-type transistors being connected together to form a second node, said first node generating said output for said latch means, said second n-type transistor having a wider dimension than said first p-type transistor;
   a capacitor coupled between said first node and the source terminal of said second n-type transistor;
   second p-type transistor having its source coupled to said first terminal of said power supply and its drain to said second node;
   third n-type transistor having its drain coupled to said second node and its gate coupled to said first node, said second p-type transistor having a wider dimension than said third n-type transistor;
   fourth n-type transistor having its drain coupled to said second node, the gate of said fourth n-type transistor coupled to receive said SET input for said latch means; and wherein said latch means forces its output to said first predetermined state upon power-on and to said second predetermined state only upon receiving an activated SET signal.

2. A circuit according to claim 1, wherein said feedback means comprises:

a NOR gate coupled to receive said output from said latch means and said predetermined system reset signal, said NOR gate activating its output when both of said output from said latch means is at said first predetermined state and said predetermined system reset signal is present, said NOR gate deactivating its output when said output from said latch means is at said second predetermined state, such that said NOR gate ignores any subsequent system reset signal not caused by a power-on.

3. A circuit according to claim 2, wherein said delay means comprises:

third p-type transistor having its gate coupled to the output from said NOR gate, the source of said third p-type transistor being coupled to said first terminal of said power supply;

fourth p-type transistor having its gate coupled to the gate of said third p-type transistor and its source to said first terminal of said power supply, the drain being coupled to said second terminal of said power supply;

fifth p-type transistor having its source coupled to the drain of said third p-type transistor, its gate being coupled to the drain of said fourth p-type transistor;

first resistor coupled between the drain of said fourth p-type transistor and the gate of said fifth p-type transistor;

second resistor coupled to the gate of said fifth p-type transistor and said second terminal of said power supply;

fifth n-type transistor having its drain coupled to the drain of said fifth p-type transistor to form an output node for said delay means, the gate of said fifth n-type transistor being coupled to said output from said latch means, said output node being coupled to said SET input of said latch means;

a capacitor coupled between said output node of said delay means and said second terminal of said power supply, wherein said output node of said delay means is pulled high by said activated output from said feedback means said predetermined delay thereafter to activate said SET input to said latch means.

4. A circuit for detecting a predetermined system reset signal caused by the turning on of power supply relative to ground of an electronic system, comprising:

a latch having a SET input and output, said latch being coupled to said power supply, said latch being unbalanced to tend to output a first predetermined state when said power supply is turned on, said latch also comprising a capacitor means coupled to said output of said latch for pulling said output to said first predetermined state upon when said power supply is turned on;

a first n-type transistor having its gate coupled to said power supply, its source coupled to said ground, and its drain coupled to said SET input of said latch, said first n-type transistor disabling said SET input when said power supply is turned on;

a NOR gate for activating its output when both of said output from said latch and said predetermined system reset signal are active;

delay means for activating its output a predetermined delay after receiving an activated output from said NOR gate, the output of said delay means being coupled to said SET input of said latch such that said latch is set to a second predetermined state when the output of said delay mean is activated, wherein said second predetermined state of said output of said latch causes said NOR gate to ignore any further predetermined system reset signals when said power supply is already on.

5. A circuit according to claim 4, wherein said latch further comprises:

first p-type transistor having its source coupled to said power supply;

a resistor coupled between said power supply and the source of said first p-type transistor;

second n-type transistor having its drain coupled to the drain of said first p-type transistor to form a first node, both gates of said first p- and n-type transistors being connected together to form a second node, said first node generating said output for said latch means, said second n-type transistor having a wider dimension than said first p-type transistor;

second p-type transistor having its source coupled to said power supply and its drain to said second node;

third n-type transistor having its drain coupled to said second node and its gate coupled to said first node, said second p-type transistor having a wider dimension than said third n-type transistor;

fourth n-type transistor having its drain coupled to said second node, the gate of said third n-type transistor coupled to receive said SET signal for said latch means, wherein said latch forcing its output to said first predetermined state upon power-on and to said second predetermined state only upon receiving an activated SET signal.

6. A circuit for detecting a predetermined system reset signal caused by the turning on of power supply of an external electronic system, comprising:

latch means coupled to said power supply having a SET input and an output, said output of said latch means being reset to a first predetermined state during power-on;

first transistor of first type coupled to said latch means having its gate coupled to a first terminal of said power supply, its source coupled to a second terminal of said power supply and its drain coupled to said SET input for deactivating said SET signal upon power-on;

feedback means for receiving said output from said latch means and said predetermined system reset signal, said feedback means activating its output when both of said first predetermined state from said latch means' output and said predetermined system reset signal are present;

delay means coupled to the output from said feedback means and to said latch means, said delay means activating its output a predetermined time after said delay means receives an activated output from said feedback means, said activated output from said delay means setting said latch means to a second predetermined state which de-activates said feedback means, said feedback means remaining de-activated when said predetermined system reset signal is applied while the power of said electronic system is already on;

said latch means comprising:
first transistor of second type having its one end of current path coupled to said first terminal of said power supply;

a resistor coupled between said power supply and said one end of path current of said first transistor of second type;

second transistor of first type having its one end of current path coupled to the other end of current path of said first transistor of second type to form a first node, both gates of said first transistor of second type and second transistor of first type being connected together to form a second node, said first node generating said output for said latch means, said second transistor of first type having a wider dimension than said first transistor of second type;

a capacitor coupled between said first node and the other end of current path of said second transistor of first type;

second transistor of second type having its one end of current path coupled to said first terminal of said power supply and the other end of current path to said second node;

third transistor of first type having its one end of current path coupled to said second node and its gate coupled to said first node, said third transistor of second type having a wider dimension than said third transistor of first type;

fourth transistor of first type having its one end of current path coupled to said second node, the gate of said fourth transistor of first type coupled to receive said SET signal for said latch means, wherein said latch means forcing its output to said first predetermined state upon power-on and to said second predetermined state only upon receiving an activated SET signal.

7. A circuit according to claim 6, wherein said feedback means comprises:

a NOR gate coupled to receive said output from said latch means and said predetermined system reset signal, said NOR gate activating its output when both of said output from said latch means is at said first predetermined state and said system reset signal is present, said NOR gate de-activating its output when said output from said latch means is at said second predetermined state, such that said NOR gate ignores any subsequent predetermined system reset signal in the absence of a power-on.

8. A circuit according to claim 7, wherein said delay means comprises:

third transistor of second type having its gate coupled to the output from said NOR gate, one end of current path of said third transistor of second type being coupled to said first terminal of said power supply;

fourth transistor of second type having its gate coupled to the gate of said third transistor of second type and its one end of current path to said first terminal of said power supply;

fifth transistor of second type having its one end of current path coupled to the other end of current path of said third transistor of second type;

first resistor coupled between the other end of current path of said fourth transistor of second type and the gate of said fifth transistor of second type;

second resistor coupled to the gate of said fifth transistor of second type and said second terminal of said power supply;

fifth transistor of first type having its one end of current path coupled to the other end of current path of said fifth transistor of second type to form an output node for said delay means, the gate of said fifth transistor of first type being coupled to said output from said latch means, said output node being coupled to said SET input of said latch means;

a capacitor coupled between said output node of said delay means and said second terminal of said power supply, wherein said output node of said delay means is pulled high by said activated output from said feedback means said predetermined delay after to activate said SET input to said latch means.

* * * * *